(12) United States Patent
Kuo

(10) Patent No.: US 7,512,000 B2
(45) Date of Patent: Mar. 31, 2009

(54) MEMORY UNIT

(75) Inventor: Ming-Chang Kuo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 169 days.

(21) Appl. No.: 11/735,910

(22) Filed: Apr. 16, 2007

(65) Prior Publication Data

US 2008/0253189 A1 Oct. 16, 2008

(51) Int. Cl.
*G11C 16/04* (2006.01)
(52) U.S. Cl. .............. 365/185.08; 365/185.05; 365/185.01
(58) Field of Classification Search ............ 365/185.08, 365/185.05, 185.01, 185.18
See application file for complete search history.

(56) References Cited

U.S. PATENT DOCUMENTS 6,965,524 B2    11/2005   Choi
7,054,194 B2 *   5/2006   Liaw et al. ............. 365/185.08

* cited by examiner

*Primary Examiner*—David Lam
(74) *Attorney, Agent, or Firm*—J.C. Patents

(57) ABSTRACT

A memory unit is provided herein. The present invention utilizes two non-volatile devices having a split gate structure to save a logic state of the memory unit. Thus, even when a power supply for the memory unit is shut down, the non-volatile devices can still save the logic state. The memory unit not only has the advantage of high speed operation of a static random access memory, but also functions as a non-volatile memory for saving data.

10 Claims, 7 Drawing Sheets

MEMORY UNIT

BACKGROUND OF THE INVENTION

1. Field of the Invention

The present invention generally relates to a memory unit, in particular, to a non-volatile memory unit.

2. Description of Related Art

Random access memory devices are mainly divided into dynamic random access memory (DRAM) and static random access memory (SRAM). The advantages of SRAM include faster operation and lower power consumption. Furthermore, compared with DRAM, the SRAM requires no periodic refreshing of the data and has a simpler design and fabrication process. As a result, SRAM has been widely adopted in many kinds of information electronic products.

Nevertheless, SRAM is a kind of volatile memory that relies on the conductive state of a transistor inside the memory cell to save data. Therefore, when the power supply to the memory is shut down, the saved data inside the SRAM will be lost.

On the other hand, electrically erasable programmable read only memory (EEPROM) allows multiple data writing, reading and erasing operations. Furthermore, the saved data will be retained even after power to the device is removed. With these advantages, EEPROM has been broadly applied non-volatile memory devices in personal computer and electronic equipment.

However, with continuous advance in technologies and the techniques of fabricating integrated circuits, information electronic products such as computers, mobile phones, digital cameras or personal digital assistants (PDA) are increasingly common. Although the amount of data that need to be processed and stored inside the information electronic product continue to increase, the basic demands for a light, portable, compact body must also be considered at the same time. Therefore, to prevent the lost of memory data when power supply to the SRAM is shut down, finding an innovative design of a semiconductor device having the advantages of high operating speed of SRAM and high storage capacity of flash memory is high on the developing list.

SUMMARY OF THE INVENTION

Accordingly, the present invention is directed to a memory unit capable of saving a data of the memory unit in non-volatile devices so that the data of the memory unit will not be lost when the power source is shut down.

According to an embodiment of the present invention, a memory unit is provided. The memory unit includes a first load unit, a second load unit, a first metal-oxide-semiconductor (MOS) transistor, a second MOS transistor, a first non-volatile device and a second non-volatile device. A first end of the first load unit is coupled to a first voltage. A second end of the first load unit is coupled to a first contact. A first end of the second load unit is coupled to the first voltage. A second end of the second load unit is coupled to a second contact. A first end of the first MOS transistor is coupled to the first contact. A second end of the first MOS transistor is coupled to the second voltage. A gate end of the first MOS transistor is coupled to the second contact. A first end of the second MOS transistor is coupled to the second contact. A second end of the second MOS transistor is coupled to a third voltage. A gate end of the second MOS transistor is coupled to the first contact. The first non-volatile device has a split-gate structure. A control gate end of the first non-volatile device is coupled to a first control bias voltage. A select gate end of the first non-volatile device is coupled to a first select bias voltage. A first end of the first non-volatile device is coupled to the first contact. A second end of the first non-volatile device is coupled to a first bit line. The second non-volatile device also has a split-gate structure. A control gate end of the second non-volatile device is coupled to a second control bias voltage. A select gate end of the second non-volatile device is coupled to a second select bias voltage. A first end of the second non-volatile device is coupled to the second contact. A second end of the second non-volatile device is coupled to a second bit line.

In an embodiment of the present invention, the first non-volatile device and the second non-volatile device of the foregoing memory unit include a substrate, a charge-trapping layer, a control gate, a select gate and a gate dielectric layer respectively. The substrate has a source region and a drain region. The charge-trapping layer is disposed on part of the area of the substrate. The control gate is disposed on the charge-trapping layer. The select gate covers part of the area of the substrate and part of the area of the control gate. The gate dielectric layer is disposed between the select gate and the substrate, between the select gate and the charge-trapping layer and between the select gate and the control gate.

In an embodiment of the present invention, the first non-volatile device and the second non-volatile device of the foregoing memory unit include a substrate, a floating gate, a control gate, a select gate and a gate dielectric layer respectively. The substrate has a source region and a drain region. The floating gate is disposed on part of the area of the substrate. The control gate is disposed on part of the floating gate. The select gate covers part of the area of the substrate and part of the area of the floating gate. The gate dielectric layer is disposed between the select gate and the substrate, between the select gate and the floating gate, between the substrate and the floating gate and between the floating gate and the control gate.

Since the memory unit of the present invention deploys non-volatile devices and the non-volatile devices have a split-gate structure, the logic state of the memory unit can be saved in the non-volatile devices. As a result, even if the power source is shut down, the data in the memory can be saved. Thus, the present invention not only has the advantage of high speed operation of a static random access memory, but also functions as a non-volatile memory for saving data.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
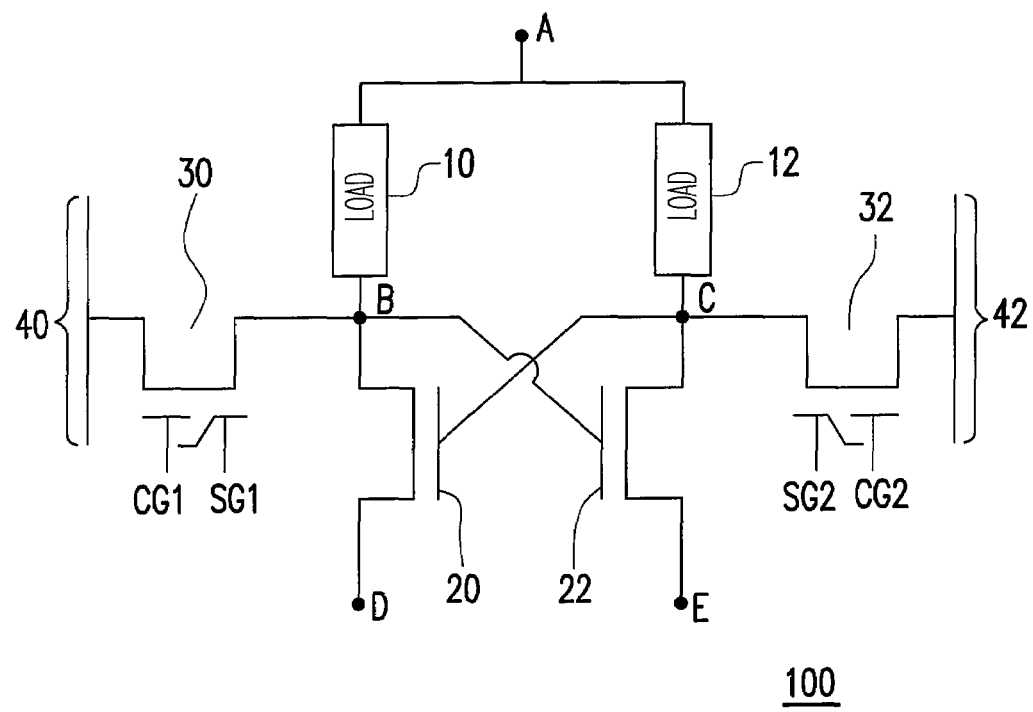
FIG. 1 is an equivalent circuit diagram of a memory unit according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is an equivalent circuit diagram of a memory unit according to a first embodiment of the present invention. The memory unit 100 includes load units 10 and 12, metal-oxide-semiconductor (MOS) transistors 20 and 22, and non-volatile devices 30 and 32. A first end of the load unit 10 is coupled to an end point A and a second end of the load unit 10 is coupled to an end point B. The end point A receives a first voltage. Similarly, a first end of the load unit 12 is coupled to the end point A and the second end of the load unit 12 is coupled to another end point C. In the present embodiment, the load units 10 and 12 can be resistors. However, the load units 10 and 12 are not intended to be limited in this way. In another selected embodiment, depletion mode transistors, P-type metal-oxide-semiconductor (PMOS) transistors, thin film transistors and so on can be used as the load units 10 and 12.

As shown in FIG. 1, a first end of the MOS transistor 20 is coupled to the end point B, a second end of the MOS transistor 20 is coupled to an end point D and a gate end is coupled to the end point C. Similarly, a first end of the MOS transistor 22 is coupled to the end point C, a second end is coupled to an end point E and a gate end is coupled to the end point B. In the present embodiment, the MOS transistors 20 and 22 are, for example, NMOS transistors.

Furthermore, in the present embodiment, a control gate end of the non-volatile device 30 is coupled to an end point CG1, a select gate end is coupled to an end point SG1, a first end is coupled to the end point B and a second end is coupled to a bit line 40. Similarly, a control gate end of the non-volatile device 32 is coupled to an end point CG2, a select gate end is coupled to an end point SG2, a first end is coupled to the end point C and a second end is coupled to a bit line 42. In a preferred embodiment, the non-volatile devices 30 and 32 can have a split-gate structure.

Figure 2A:
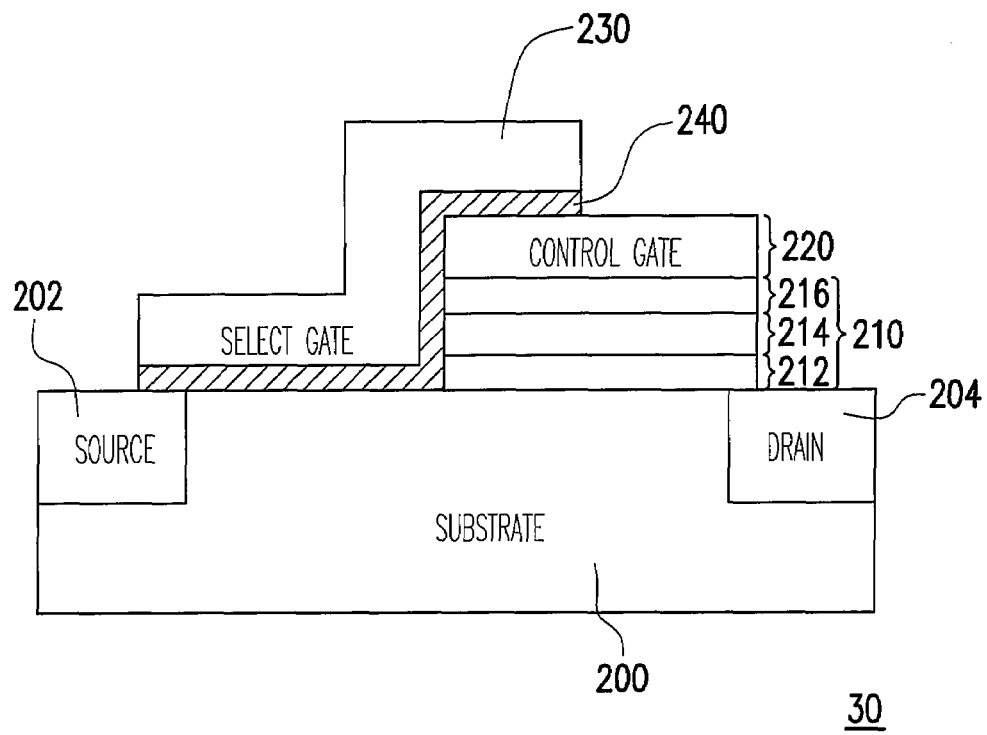
FIG. 2A is a schematic cross-sectional view of a non-volatile device according to the first embodiment of the present invention.

FIG. 2A is a schematic cross-sectional view of a non-volatile device according to the first embodiment of the present invention. As shown in FIG. 2A, the cross-sectional structure of both of the non-volatile devices 30 and 32 are substantially identical. Therefore, only the non-volatile device 30 is described. The non-volatile device 30 includes a substrate 200, a charge-trapping layer 210, a control gate 220, a select gate 230 and a gate dielectric layer 240.

The substrate 200 (for example, a P-type substrate) has a source region 202 and a drain region 204 therein. The charge-trapping layer is disposed on part of the area of the substrate 200. The control gate 220 is disposed on the charge-trapping layer 210. The select gate 230 covers part of the area of the substrate 200 and part of the area of the control gate 220. The gate dielectric layer 240 can be disposed between the select gate 230 and the substrate 200, between the select gate 230 and the charge-trapping layer 210 and between the select gate 230 and the control gate 220.

The material of the control gate 220 and the select gate 230 is, for example, doped polysilicon or other suitable conductive material. The charge-trapping layer 210 is, for example, comprised of an oxide layer 212, a nitride layer 214 and an oxide layer 216. The material of the oxide layers 212 and 216 is, for example, silicon oxide (SiO or $SiO_2$). The material of the nitride layer 214 is, for example, silicon nitride (SiN). The material of the gate dielectric layer 240 is, for example, silicon oxide. Since the charge-rapping layer 210 can be used for trapping electric charges, the non-volatile device 30 and the non-volatile device 32 can be used to save the data of the memory unit 100 so that the data will not be lost when power supply is interrupted.

Figure 2B:
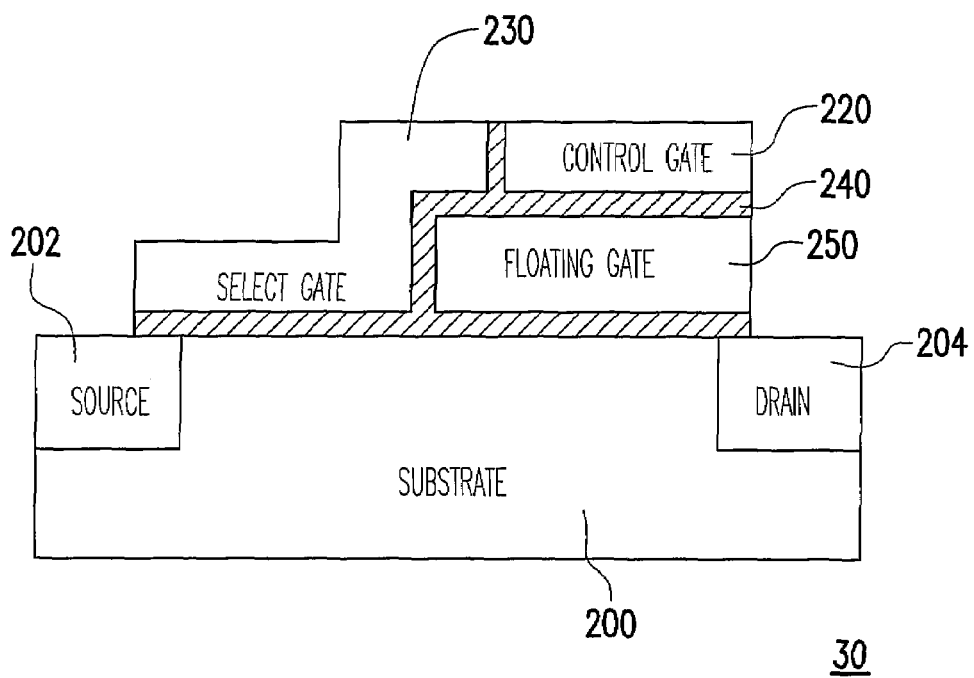
FIG. 2B is a schematic cross-sectional view of another non-volatile device according to the first embodiment of the present invention.

Anybody skilled in the art can make some modifications and variations to the structure of the non-volatile device according to the description provided by the foregoing embodiments without departing from the spirit and scope of the present invention. For example, FIG. 2B is a schematic cross-sectional view of another non-volatile device according to the first embodiment of the present invention. As shown in FIG. 2B, the cross-sectional structure of both of the non-volatile devices 30 and 32 are substantially identical. Therefore, only the non-volatile device 30 is described. The non-volatile device 30 includes a substrate 200, a floating gate 250, a control gate 220, a select gate 230 and a gate dielectric layer 240.

The foregoing substrate 200 is, for example, a P-type substrate having a source region 202 and a drain region 204 therein. The floating gate 250 is disposed on part of the area of the substrate 200. Because the floating gate 250 can be used for trapping electric charges, the non-volatile device 30 and the non-volatile device 32 are able to save data of the memory unit 100 so that the data will not be lost when the power supply is interrupted. The control gate 220 is disposed on part of the area of the floating gate 250. The select gate 230 covers part of the area of the substrate 200 and part of the area of the floating gate 250. The material of the control gate 220, the select gate 230 and the floating gate 250 is, for example, doped polysilicon or other suitable conductive material.

In the present embodiment, the gate dielectric layer 240 can be disposed between the select gate 230 and the substrate 200, between the select gate 230 and the floating gate 250, between the substrate 200 and the floating gate 250 and between the floating gate 250 and the control gate 240. The material of the gate dielectric layer 240 is, for example, silicon oxide. Next, a more detailed description of various modes of operating the memory units 100 is provided.

In the present embodiment, a logic 1 is saved in the memory unit 100 when the end point B of the memory unit 100 is at a logic high voltage and the end point C is a logic low voltage. Conversely, a logic 0 is saved in the memory unit 100 when the end point B of the memory unit 100 is at a logic low voltage and the end point C is a logic high voltage.

Figure 3A:
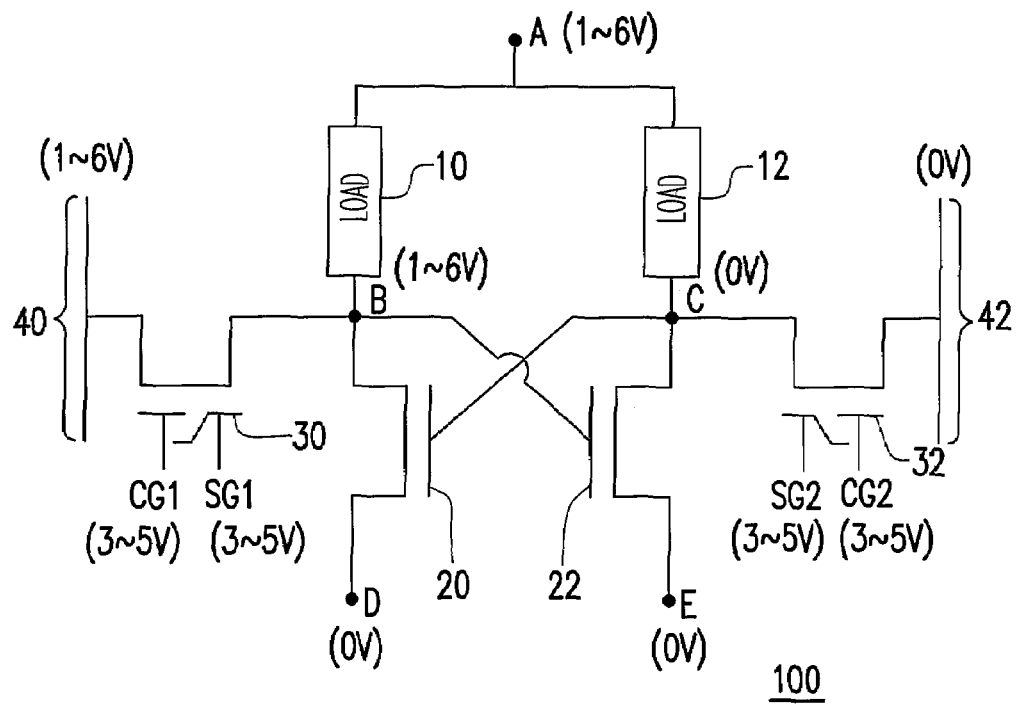
FIG. 3A is a circuit diagram showing the configuration for writing a data of logic 1 into the memory unit according to the first embodiment of the present invention.

FIG. 3A is a circuit diagram showing the configuration for writing a data of logic 1 into the memory unit according to the first embodiment of the present invention. As shown in FIG. 3A, assume that a data of logic value 1 needs to be written into the memory unit 100. First, a logic high voltage signal, for example, a voltage between 1~6V is provided to the end point A and the bit line 40, and a logic low voltage signal, for example, a voltage of 0V is provided to the end points D and E and the bit line 42. Meanwhile, a control bias voltage having, for example, a voltage between 3~5V is provided to the end points CG1 and CG2, and a select bias voltage having, for example, a voltage between 3~5V is provided to the end points SG1 and SG2. Thus, both non-volatile devices 30 and 32 are turned on. Consequently, the logic high voltage of the bit line 40 is saved at the end point B and the logic low voltage of the bit line 42 is saved at the end point C.

Figure 3B:
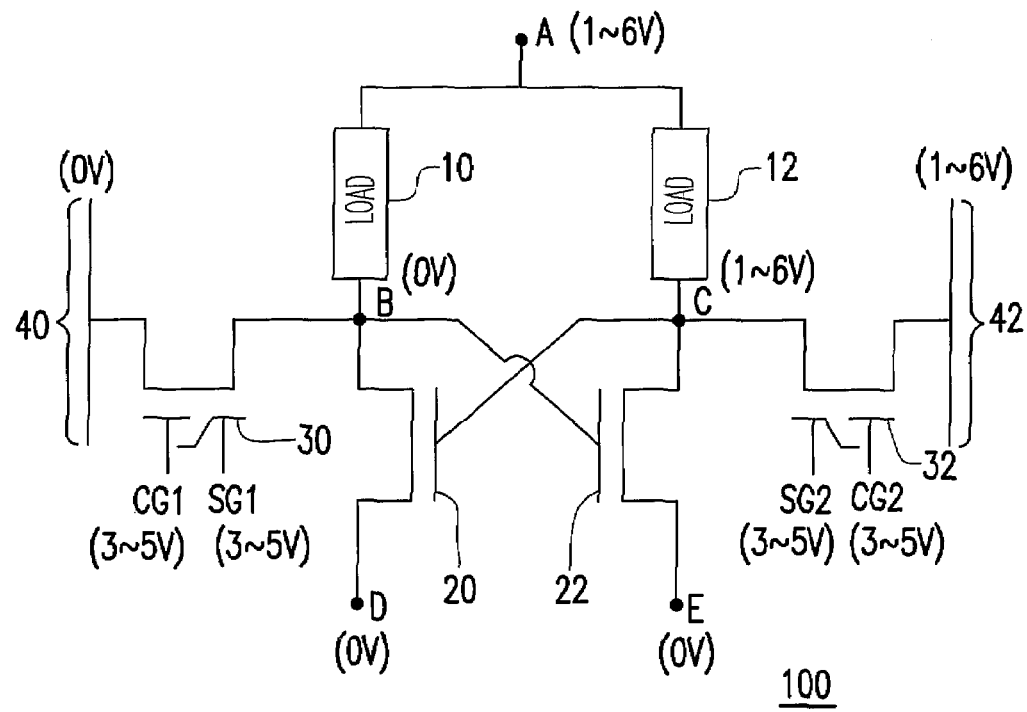
FIG. 3B is a circuit diagram showing the configuration for writing a data of logic 0 into the memory unit according to the first embodiment of the present invention.

FIG. 3B is a circuit diagram showing the configuration for writing a data of logic 0 into the memory unit according to the first embodiment of the present invention.

As shown in FIG. 3B, assume that a data of logic value 0 needs to be written into the memory unit 100. First, a logic high voltage signal, for example, a voltage between 1~6V is provided to the end point A and the bit line 42, and a logic low voltage signal, for example, a voltage of 0V is provided to the end points D and E and the bit line 40.

Meanwhile, a control bias voltage having, for example, a voltage between 3~5V is provided to the end points CG1 and CG2, and a select bias voltage having, for example, a voltage between 3~5V is provided to the end points SG1 and SG2. Thus, both non-volatile devices 30 and 32 are turned on. Consequently, the logic low voltage of the bit line 40 is saved at the end point B and the logic high voltage of the bit line 42 is saved at the end point C.

Figure 4:
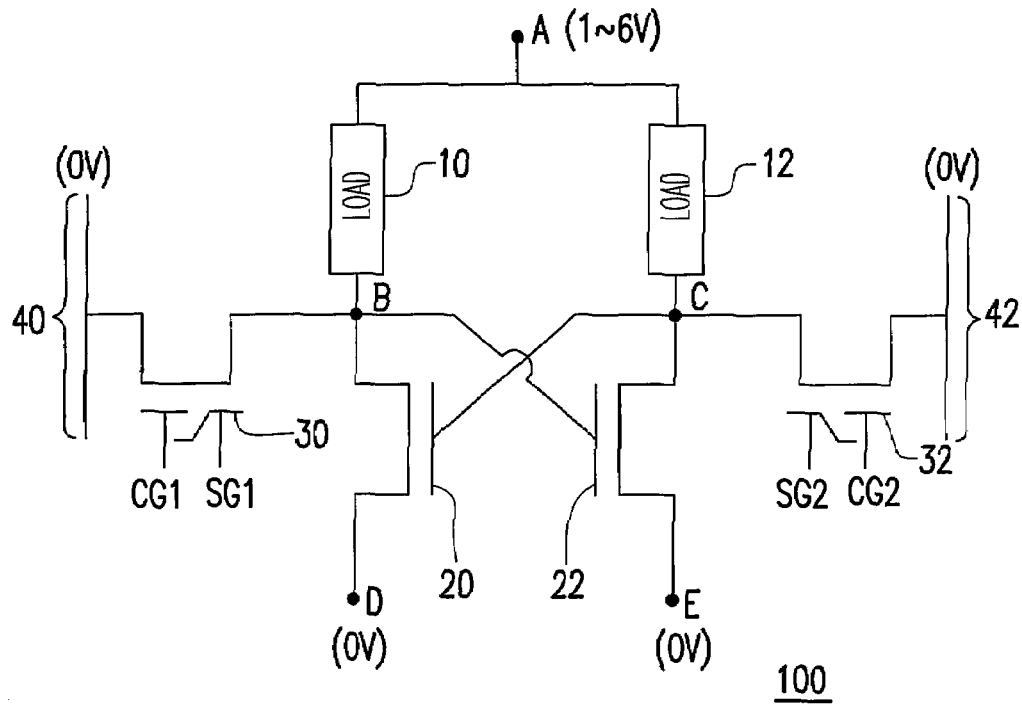
FIG. 4 is a circuit diagram showing the memory unit according to the first embodiment of the present invention configured in a maintain state.

FIG. 4 is a circuit diagram showing the memory unit according to the first embodiment of the present invention configured in a maintain state. As shown in FIG. 4, assume that the data of the memory unit 100 needs to be in a maintain state. First, a logic high voltage signal having, for example, a voltage between 1~6V is provided to the end point A and a logic low voltage signal having, for example, a voltage of 0V is provided to the end points D and E and the bit lines 40 and 42. Therefore, both non-volatile devices 30 and 32 are turned off. Consequently, the end points B and C are configured in the maintain state.

Figure 5A:
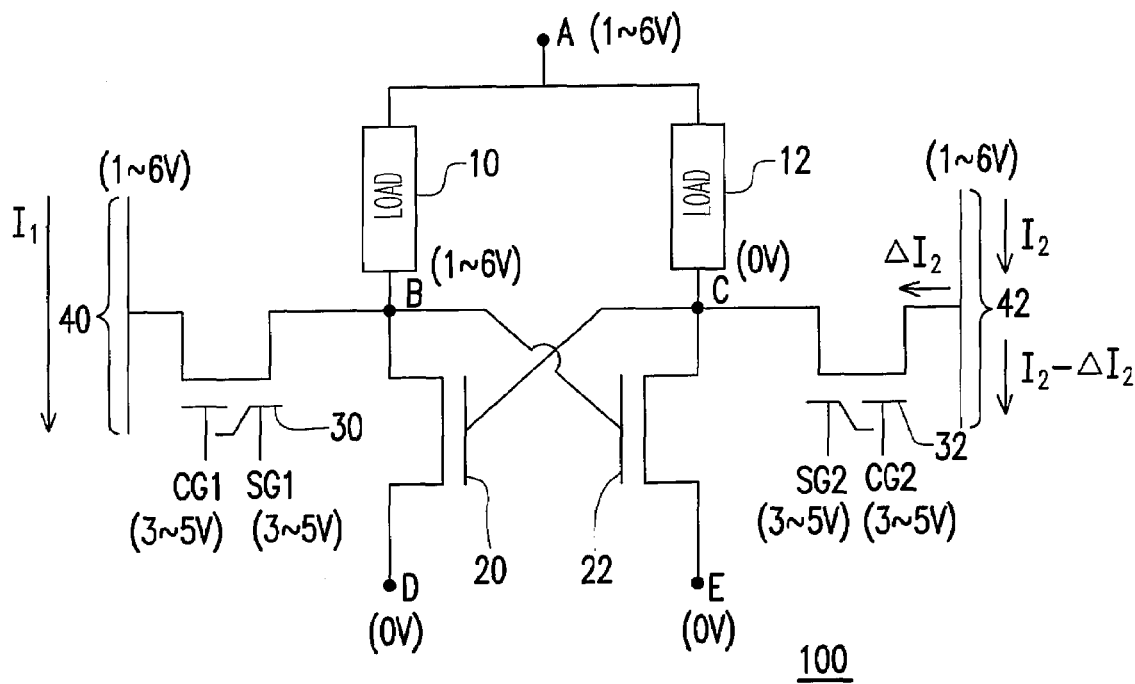
FIG. 5A is a circuit diagram showing the configuration for reading a saved data of logic 1 from the memory unit according to the first embodiment of the present invention.

FIG. 5A is a circuit diagram showing the configuration for reading a saved data of logic 1 from the memory unit according to the first embodiment of the present invention. As shown in FIG. 5A, assume that a data of logic 1 is saved in the memory unit 100 in the present embodiment. When the saved data of logic 1 needs to be read from the memory unit 100, a logic high voltage signal having, for example, a voltage between 1~6V is provided to the end point A and a first end of the bit lines 40 and 42, and a logic low voltage signal, for example, a voltage of 0V is provided to the end points D and E. Meanwhile, a control bias voltage having, for example, a voltage between 3~5V is provided to the end points CG1 and CG2, and a select bias voltage having, for example, a voltage between 3~5V is provided to the end points SG1 and SG2 so as to turn on the non-volatile devices 30 and 32.

Although the non-volatile device is turned on, hardly any current passes through the non-volatile device 30 because the voltage at the end point B and the voltage at the bit line 40 are identical. In other words, if the first end of the bit line 40 provides a current I1, the second end of the bit line 40 will receive the current I1. On the other hand, the voltage at the end point C is lower than the voltage at the bit line 42. Therefore, if the first end of the bit line 42 provides a current I2, then a portion of the current ΔI2 will pass through the non-volatile device 32, the end point C, the MOS transistor 22 and finally arrive at the end point E in sequence. As a result, the second end of the bit line 42 will receive a current I2−ΔI2.

Anybody skilled in the art should be able to read out the logic state of the data saved in the memory unit 100 by sensing the difference in output current between the second end of the bit line 40 and the second end of the bit line 42 using a sense amplifier (not shown). For example, if the output current of the second end of the bit line 40 is larger than the output current of the second end of the bit line 42, then the initial state of the memory unit 100 is a logic 1.

Figure 5B:
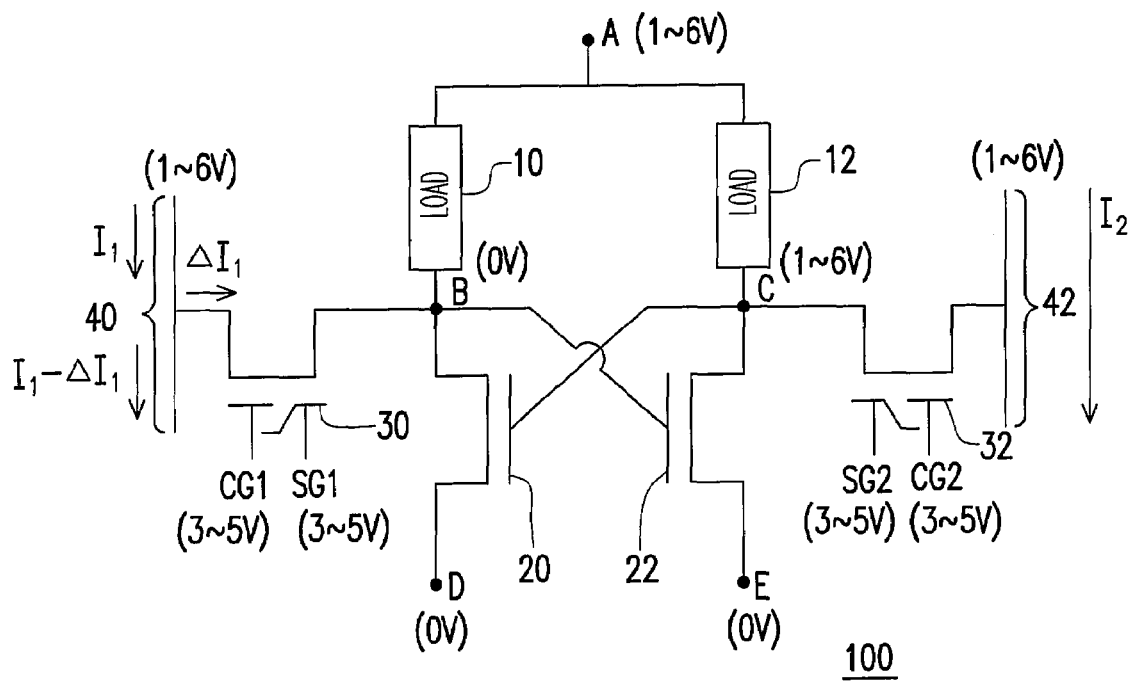
FIG. 5B is a circuit diagram showing the configuration for reading a saved data of logic 0 from the memory unit according to the first embodiment of the present invention.

FIG. 5B is a circuit diagram showing the configuration for reading a saved data of logic 0 from the memory unit according to the first embodiment of the present invention. As shown in FIG. 5B, assume that a data of logic 0 is saved in the memory unit 100 in the present embodiment. When the saved data of logic 0 needs to be read from the memory unit 100, a logic high voltage signal having, for example, a voltage between 1~6V is provided to the end point A and a first end of the bit lines 40 and 42, and a logic low voltage signal having, for example, a voltage of 0V is provided to the end points D and E. Meanwhile, a control bias voltage having, for example, a voltage between 3~5V is provided to the end points CG1 and CG2, and a select bias voltage having, for example, a voltage between 3~5V is provided to the end points SG1 and SG2 so as to turn on the non-volatile devices 30 and 32. Since the theory for reading the saved data of logic 0 from the memory unit 100 is similar to the one for reading the saved data of logic 1 as described using FIG. 5A, a detailed description is omitted.

Figure 6A:
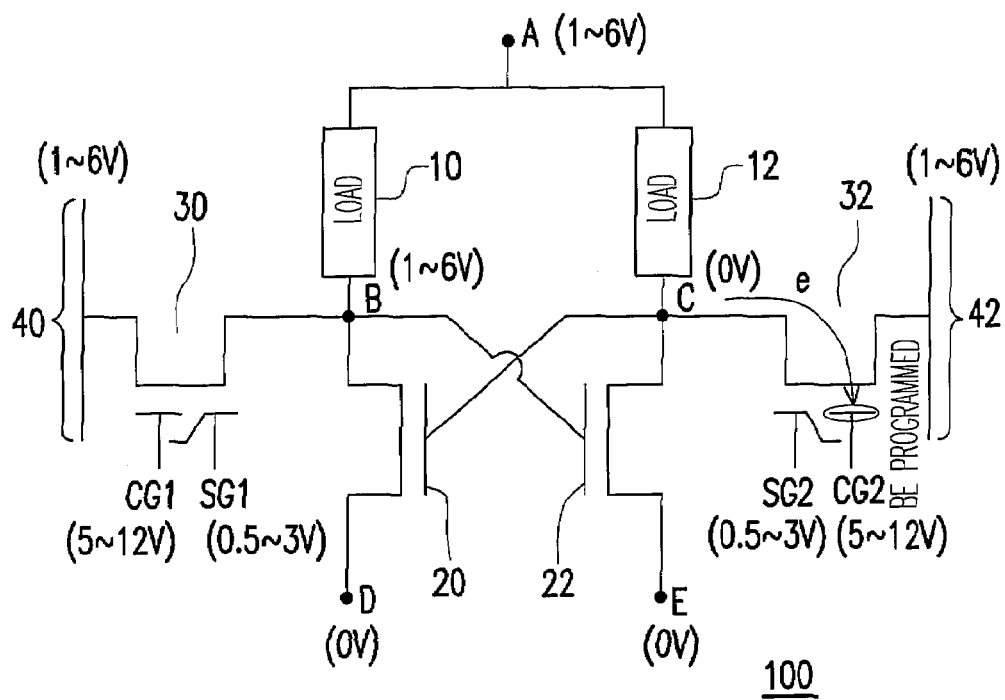
FIG. 6A is a circuit diagram showing the configuration for writing data of logic 1 of the memory unit into the non-volatile device according to the first embodiment of the present invention.

FIG. 6A is a circuit diagram showing the configuration for writing data of logic 1 of the memory unit into the non-volatile device according to the first embodiment of the present invention. As shown in FIG. 6A, assume that the data saved in the initial state of the memory unit 100 is logic 1. When a data of logic 1 needs to be written into the non-volatile device 32, a logic high voltage signal having, for example, a voltage between 1~6V is provided to the end point A and a first end of the bit lines 40 and 42, and a logic low voltage signal having, for example, a voltage of 0V is provided to the end points D and E. Meanwhile, a control bias voltage having, for example, a voltage between 5~12V is provided to the end points CG1 and CG2, and a select bias voltage having, for example, a voltage between 0.5~3V is provided to the end points SG1 and SG2.

Because of a considerable voltage difference between the end point C and the bit line 42, electrons will be injected from the end point C through the source of the non-volatile device 32 into the charge-trapping layer or the floating gate of the non-volatile device 32. Consequently, the non-volatile device 32 is programmed. On the other hand, the voltage difference between the end point B and the bit line 40 is too small so that the non-volatile device 30 is not programmed. In this way, a data of logic 1 is written into the non-volatile device 32. In other words, the programmed state of the non-volatile device 32 is still maintained even if the power source is shut down.

Figure 6B:
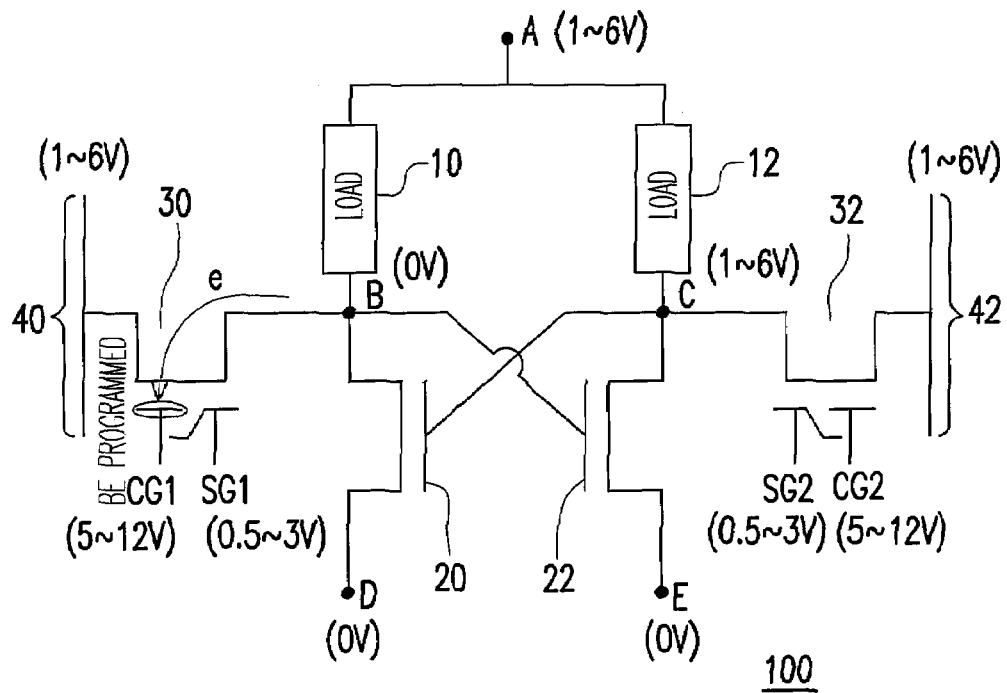
FIG. 6B is a circuit diagram showing the configuration for writing a data of logic 0 of the memory unit into the non-volatile device according to the first embodiment of the present invention.

FIG. 6B is a circuit diagram showing the configuration for writing data of logic 0 of the memory unit into the non-volatile device according to the first embodiment of the present invention. As shown in FIG. 6B, assume that the data saved in the initial state of the memory unit 100 is logic 0. When a data of logic 0 needs to be written into the non-volatile device 30, a logic high voltage signal having, for example, a voltage between 1~6V is provided to the end point A and a first end of the bit lines 40 and 42, and a logic low voltage signal having, for example, a voltage of 0V is provided to the end points D and E. Meanwhile, a control bias voltage having, for example, a voltage between 5~12V is provided to the end points CG1 and CG2, and a select bias voltage having, for example, a voltage between 0.5~3V is provided to the end points SG1 and SG2.

Because of a considerable voltage difference between the end point B and the bit line 40, electrons will be injected from the end point B through the source of the non-volatile device 30 into the charge-trapping layer or the floating gate of the non-volatile device 30. Consequently, the non-volatile device 30 is programmed. On the other hand, the voltage difference between the end point C and the bit line 42 is too small so that the non-volatile device 32 is not programmed. In this way, a data of logic 0 is written into the non-volatile device 30. In other words, the programmed state of the non-volatile device 30 is still maintained even if the power source is shut down.

Figure 7A:
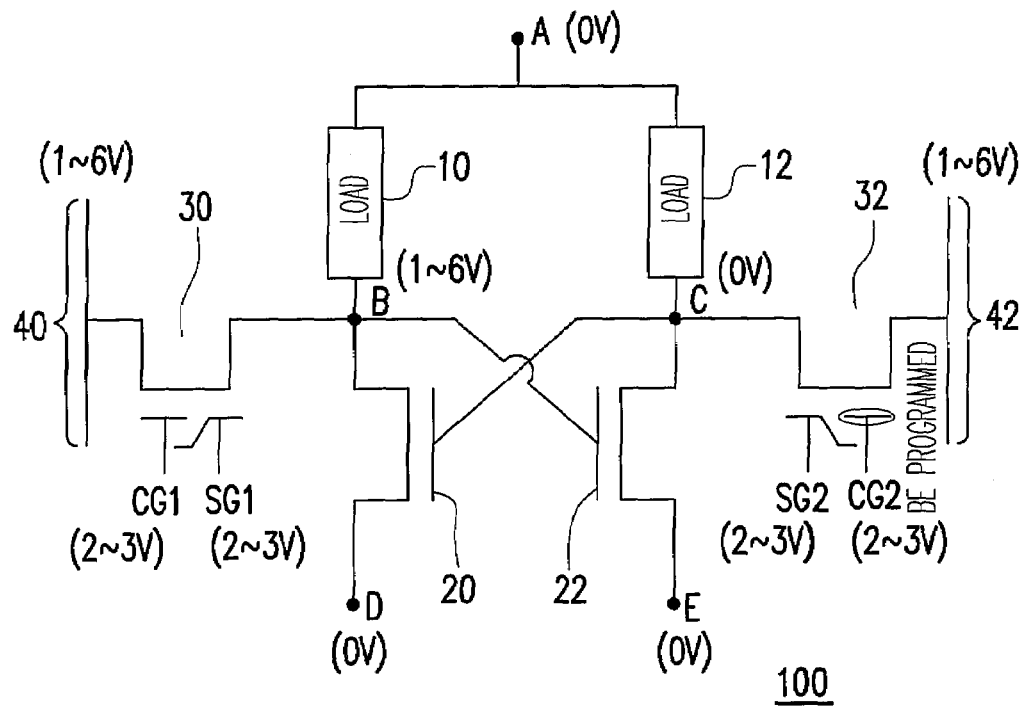
FIG. 7A is a circuit diagram showing the configuration for restoring a data of logic 1 from the non-volatile device according to the first embodiment of the present invention.

FIG. 7A is a circuit diagram showing the configuration for restoring a data of logic 1 from the non-volatile device according to the first embodiment of the present invention. As shown in FIG. 7A, assume that the non-volatile device 32 has been programmed in the beginning. First, a logic high voltage signal having, for example, a voltage between 1~6V is provided to the bit lines 40 and 42, and a logic low voltage signal having, for example, a voltage of 0V is provided to the end points A, D and E. Meanwhile, a control bias voltage having, for example, a voltage between 2~3V is provided to the end points CG1 and CG2, and a select bias voltage having, for example, a voltage between 2~3V is provided to the end points SG1 and SG2.

Since the non-volatile device 30 has not been programmed, the non-volatile device 30 is turned on. In other words, the bit line 40 will charge the end point B and turn the end point B into a logic high voltage. On the other hand, because the non-volatile device 32 has been programmed, the non-volatile device 32 is turned off. In addition, the logic high voltage at the end point B will turn on the MOS transistor 22. In other words, the end point C is kept in a logic low voltage. In this way, the data of logic 1 is restored from the non-volatile device 32.

Figure 7B:
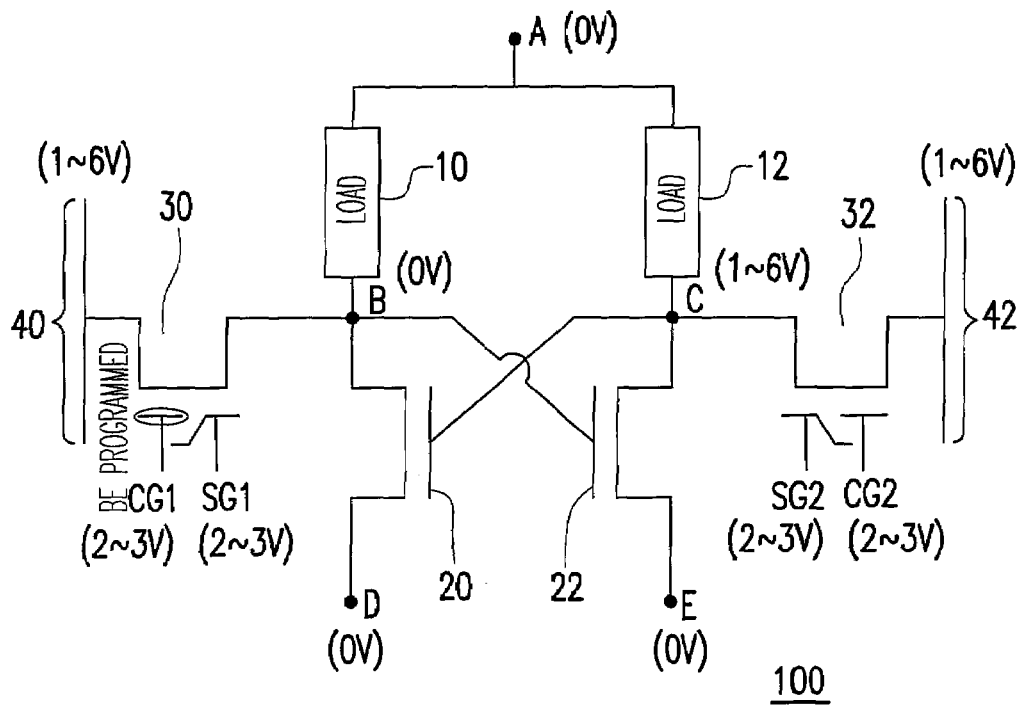
FIG. 7B is a circuit diagram showing the configuration for restoring a data of logic 0 from the non-volatile device according to the first embodiment of the present invention.

FIG. 7B is a circuit diagram showing the configuration for restoring a data of logic 0 from the non-volatile device according to the first embodiment of the present invention. As shown in FIG. 7B, assume that the non-volatile device 30 has been programmed in the beginning. First, a logic high voltage signal having, for example, a voltage between 1~6V is provided to the bit lines 40 and 42, and a logic low voltage signal having, for example, a voltage of 0V is provided to the end points A, D and E. Meanwhile, a control bias voltage having, for example, a voltage between 2~3V is provided to the end points CG1 and CG2, and a select bias voltage having, for example, a voltage between 2~3V is provided to the end points SG1 and SG2.

Since the non-volatile device 32 has not been programmed, the non-volatile device 32 is turned on. In other words, the bit line 42 will charge the end point C and turn the end point C into a logic high voltage. On the other hand, because the non-volatile device 30 has been programmed, the non-volatile device 30 is turned off. In addition, the logic high voltage at the end point C will turn on the MOS transistor 20. In other words, the end point B is kept in a logic low voltage. In this way, the data of logic 0 is restored from the non-volatile device 30.

Figure 8:
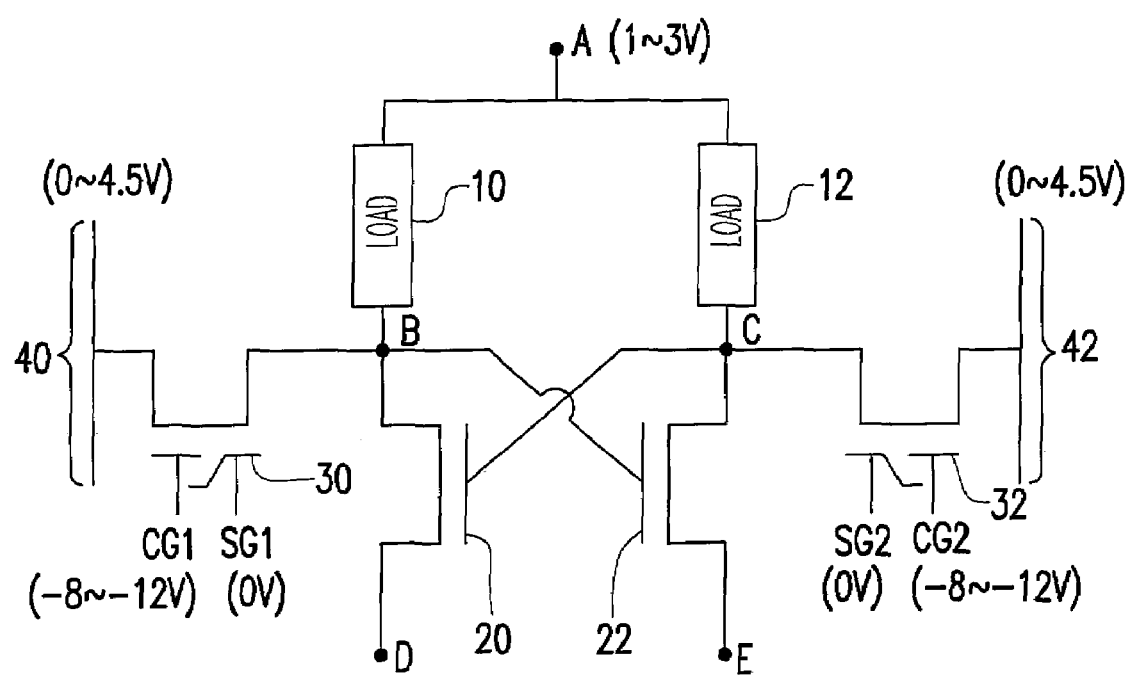
FIG. 8 is a circuit diagram showing the configuration for erasing the programmed state of a non-volatile device according to the first embodiment of the present invention.

FIG. 8 is a circuit diagram showing the configuration for erasing the programmed state of a non-volatile device according to the first embodiment of the present invention. As shown in FIG. 8, assume that the non-volatile device 30 or the non-volatile device 32 has already been programmed in the beginning. First, a voltage signal having, for example, a voltage between 0~4.5V is provided to the bit lines 40 and 42, and a voltage signal having, for example, a voltage between 1~3V is provided to the end point A so as to maintain the logic state of the end points B and C. In addition, a logic low voltage signal having, for example, a voltage of 0V s provided to the end points D and E. Meanwhile, a control bias voltage having, for example, a voltage between −8~−12V is provided to the end points CG1 and CG2, and a select bias voltage having, for example, a voltage of 0V is provided to the end points SG1 and SG2. As a result, the control gates of the non-volatile devices 30 and 32 are forced to release electrons. In other words, band-to-band hot holes (BTBHH) or floating gate tunnelling is utilised to eliminate the programmed states of the non-volatile device 30 and the non-volatile device 32. Therefore, the non-volatile devices 30 and 32 can be repeatedly programmed.

In summary, the embodiment in the present invention has at least the following advantages:

1. Because the memory unit deploys split-gate non-volatile devices, the logic state of the memory unit can be saved in the non-volatile devices. As a result, the data saved in the memory can be retained even after the power source is shut down. Moreover, when the power source is turned on again, the data can be read out from the non-volatile devices.

2. The memory unit not only has the advantage of high speed operation of a static random access memory, but also functions as a non-volatile memory for saving data.

3. By replacing the conventional transistors of a memory unit with non-volatile devices, the capacity for saving data in the non-volatile devices in a memory occupying the same area is enhanced without increasing the dimensions of the memory unit. Therefore, overall integration of the devices is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory unit, comprising:
a first load unit, having a first end coupled to a first voltage, and a second end coupled to a first contact;
a second load unit, having a first end coupled to the first voltage, and a second end coupled to a second contact;
a first metal-oxide-semiconductor (MOS) transistor, having a first end coupled to the first contact, a second end coupled to a second voltage, and a gate coupled to the second contact;
a second MOS transistor, having a first end coupled to the second contact, a second end coupled to a third voltage, and a gate coupled to the first contact;
a first non-volatile device having a split-gate structure, and having a control gate coupled to a first control bias voltage, a select gate coupled to a first select bias voltage, a first end coupled to the first contact, and a second end coupled to a first bit line; and
a second non-volatile device having a split-gate structure, and having a control gate coupled to a second control bias voltage, a select gate coupled to a second select bias voltage, a first end coupled to the second contact, and a second end coupled to a second bit line.

2. The memory unit according to claim 1, wherein the first non-volatile device and the second non-volatile device respectively comprises:
   a substrate, having a source region and a drain region;
   a charge-trapping layer, disposed on part of the area of the substrate;
   a control gate, disposed on the charge-trapping layer;
   a select gate, covering part of the area of the substrate and part of the area of the control gate; and
   at least one gate dielectric layer, disposed between the select gate and the substrate, between the select gate and the charge-trapping layer and between the select gate and the control gate.

3. The memory unit according to claim 2, wherein the charge-trapping layer sequentially comprises an oxide layer, a nitride layer and an oxide layer.

4. The memory unit according to claim 3, wherein a material of the oxide layer comprises silicon oxide.

5. The memory unit according to claim 3, wherein a material of the nitride layer comprises silicon nitride.

6. The memory unit according to claim 3, wherein a material of the gate dielectric layer comprises silicon oxide.

7. The memory unit according to claim 1, wherein the first non-volatile device and the second non-volatile device respectively comprises:
   a substrate, having a source region and a drain region;
   a floating gate, disposed on part of the area of the substrate;
   a control gate, disposed on part of the area of the floating gate;
   a select gate, covering part of the area of the substrate and part of the area of the floating gate; and
   at least one gate dielectric layer, disposed between the select gate and the substrate, between the select gate and the floating gate, between the substrate and the floating gate and between the floating gate and the control gate.

8. The memory unit according to claim 7, wherein a material of the gate dielectric layer comprises silicon oxide.

9. The memory unit according to claim 1, wherein the first load unit and the second load unit are depletion transistors, P-type metal-oxide-semiconductor transistors, thin film transistors or resistors.

10. The memory unit according to claim 1, wherein the first MOS transistor and the second MOS transistor are N-type metal-oxide-semiconductor transistors.

* * * * *